United States Patent [19]

Abele

[11] Patent Number: 5,210,004
[45] Date of Patent: May 11, 1993

[54] PHOTOPOLYMERIZABLE PRINTING PLATE FOR FLEXOGRAPHIC PRINTING

[75] Inventor: Werner Abele, Neu-Isenburg, Fed. Rep. of Germany

[73] Assignee: E. I. Du Pont de Nemours and Company, Wilmington, Del.

[21] Appl. No.: 726,680

[22] Filed: Jul. 8, 1991

[30] Foreign Application Priority Data

Jul. 19, 1990 [DE] Fed. Rep. of Germany ....... 4022979

[51] Int. Cl.$^5$ ................................. G03F 7/11
[52] U.S. Cl. ........................ 430/272; 430/273; 430/306
[58] Field of Search ............... 430/273, 272, 306

[56] References Cited

U.S. PATENT DOCUMENTS

| | | | |
|---|---|---|---|
| 4,162,919 | 7/1979 | Richter et al. | 96/87 |
| 4,238,560 | 12/1980 | Nakamura et al. | 430/162 |
| 4,266,005 | 5/1981 | Nakamura et al. | 430/271 |
| 4,320,188 | 3/1982 | Heinz et al. | 430/281 |
| 4,323,636 | 4/1982 | Chen | 430/271 |
| 4,343,637 | 4/1982 | Chen et al. | 430/271 |
| 4,369,246 | 1/1983 | Chen et al. | 430/306 |
| 4,423,135 | 12/1983 | Chen et al. | 430/271 |
| 4,427,759 | 1/1984 | Gruetzmacher et al. | 430/273 |
| 4,430,417 | 2/1984 | Heinz et al. | 430/286 |
| 4,460,675 | 7/1984 | Gruetzmacher et al. | 430/300 |

FOREIGN PATENT DOCUMENTS 3744243 2/1989 Fed. Rep. of Germany .

Primary Examiner—Cynthia Hamilton

[57] ABSTRACT

A photopolymerizable printing element comprising a photopolymerizable layer and an elastomeric layer coated thereon wherein said elastomeric layer contains at least one thermoplastic, elastomeric block copolymer and at least one reaction product of an epoxide resin with a rosin derivative. The element produces flexographic printing plates having improved printing results with aqueous and alcoholic printing inks.

8 Claims, No Drawings

PHOTOPOLYMERIZABLE PRINTING PLATE FOR FLEXOGRAPHIC PRINTING

FIELD OF THE INVENTION

This invention relates to flexographic printing plates and more particularly, to photopolymerizable printing elements comprising a photopolymerizable layer and an elastomeric layer applied thereon wherein said elastomeric layer contains at least one thermoplastic, elastomeric block copolymer and at least one reaction product of an epoxide resin with an adduct of unsaturated monocarboxylic and/or polycarboxylic acids or their anhydrides with rosins, the adduct having been partially esterified with polyols.

BACKGROUND OF THE INVENTION

The use of photopolymerizable recording materials for the production of flexographic printing plates on which the printing surface is produced by imagewise exposure of a light-sensitive layer and subsequent removal of the unexposed portions of the layer is well known in the art. In this art area, solid photopolymerizable materials are differentiated from those on which the imagewise exposure is made in liquid systems. In addition, there are recording materials that are aqueous-developable and those that can be developed with organic solvents.

U.S. Pat. No. 4,238,560 discloses, for example, aqueous-developable printing plates comprising a support, a photosensitive layer, and a matting layer. In development with aqueous solutions, the entire matting layer is removed as well as the non-image portions of the photosensitive layer. In addition to the actual matting material, the matting layer contains rosin or rosin esters, which, as described in Ullmann's "Encyclopedia of Chemical Technology", 4th edition, volume 12, pages 530–536, Verlag Chemie, Weinheim, 1976, are used for their high pigment compatibility in paints and printing inks.

Compared to solvent-developable materials, a particular shortcoming of aqueous-developable printing plates is their low resistance to alcoholic and aqueous printing inks, which swell the printing surface and thereby cause defective printing.

Examples of solid, solvent-developable recording materials are disclosed in DE-C3 22 15 090 (U.S. Pat. Nos. 4,323,636; 4,323,637; 4,369,246; 4,423,135) U.S. Pat. Nos. 4,266,005, 4,320,188, and 4,430,417. Such photopolymerizable printing plates usually comprise a support, optionally an adhesive or other underlayer, a photopolymerizable layer containing at least one polymeric binder, at least one ethylenically unsaturated monomer that can be addition-polymerized by actinic radiation, and a photoinitiator or photoinitiator system, and a cover element comprising a flexible, polymeric film soluble in the developer solvent, and a separable cover sheet.

A preferred method for preparing such multilayer, photopolymerizable printing plates is a process in which a previously extruded photopolymerizable composition is fed into the nip of a calender and calendered between a support and a cover element, thus forming a photopolymerizable layer between them.

EP-B1 00 84 851 (U.S. Pat. Nos. 4,427,759 and 4,460,675), discloses preparing a multilayer, photopolymerizable printing element having an elastomeric layer between the flexible polymeric film of the cover element and the photopolymerizable layer. The elastomeric layer contains an elastomeric binder, and as optional constituents, a second binder, a dye, one or more monomers, and a photoinitiator.

However, flexographic printing plates prepared from the described solvent-developable materials often have various deficiencies, among which uneven printing quality is especially noteworthy. Thus, with alcoholic and aqueous flexographic printing inks, unsatisfactory printing results are obtained, because inadequate ink transfer in printing leads to inking defects. The transfer of 5% dots is particularly prone to defects in the use of such printing inks.

Accordingly, the object of the present invention is to eliminate the above-cited printing problems and make available a solid, photopolymerizable printing element for preparing flexographic printing plates having improved ink transfer. In addition, the usual washoff development with organic solvents should be feasible. At the same time, other properties of the photopolymerizable printing plates should not be affected adversely. For example, reduction in photosensitivity should be avoided. Moreover, the flexographic printing plates should not swell in printing inks, because such swelling causes undesirable dot growth and consequently, defective printing.

Surprisingly, the aforementioned objectives are achieved by using a photopolymerizable printing element comprising a support (a), a photopolymerizable layer (b) containing at least one elastomeric binder, at least one ethylenically unsaturated monomer addition-polymerizable by actinic radiation, and a photoinitiator or photoinitiator system, an elastomeric layer (c) containing at least one thermoplastic, elastomeric block copolymer, and a cover sheet (d).

SUMMARY OF THE INVENTION

The invention relates to a photopolymerizable printing element comprising:
(a) a support;
(b) a photopolymerizable layer containing at least one elastomeric binder, at least one ethylenically unsaturated monomer addition-polymerizable by actinic radiation, and a photoinitiator or photoinitiator system;
(c) an elastomeric layer containing at least one thermoplastic, elastomeric block copolymer; and
(d) a cover sheet, wherein the elastomeric layer (c) further comprises at least one reaction product of an epoxide resin with an adduct, partially esterified with polyols, of unsaturated monocarboxylic and/or polycarboxylic acids or their anhydrides with rosins.

Another aspect of the invention relates to a process for preparing a photopolymerizable printing element.

A further aspect of the invention relates to a process for preparing a coating solution for the elastomeric layer (c) of the photopolymerizable printing element.

The invention also relates to a process for preparing flexographic printing plates.

DETAILED DESCRIPTION OF THE INVENTION

The elastomeric layer (c) of the invention also contains at least one reaction product of an epoxide resin with an adduct of unsaturated monocarboxylic and/or polycarboxylic acids or their anhydrides with rosins, the adduct having been partially esterified with polyols.

Surprisingly and unexpectedly, the relatively polar compounds essential to the invention are satisfactorily compatible with the thermoplastic, elastomeric block copolymers of elastomeric layer (c). One skilled in the art would have expected these polymers to be incompatible with each other or at least show limited compatibility and therefore, when the various layers of a photopolymerizable printing plate are calendered together, the compounds of the invention would exude out of the elastomeric layer. In addition, one skilled in the art would also expect that the layers of the printing element or printing plate would separate from one another because of the incompatibility of the compounds of the invention with the other components. Contrary to these expectations, the photopolymerizable printing element of the present invention and the printing plates prepared therefrom, demonstrate high stability and uniform properties.

Furthermore, conventional development with organic solvents is possible without the use of special additives, although the compounds essential to the invention behave in solution altogether differently from the other components of the photopolymerizable printing plate, as the above-cited use of structurally similar compounds in aqueous-developable materials exemplifies. Surprisingly, the compounds essential to the invention do not wash off and printing plates prepared from the invention are not swollen by polar flexographic printing inks, as an artisan would have expected from experience with aqueous-developable printing plates.

To the contrary, the printing performance of solvent-developable printing plates for flexographic printing was improved considerably by addition of the elastomeric layer (c) of the invention.

The elastomeric layer (c) of the photopolymerizable printing element of the invention contains 5 to 30%, preferably 15 to 25 percent by weight, epoxide resin/rosin reaction product. If less than five percent by weight is used, no significant improvement in printing quality is observed. If more than 30 percent by weight is used, the resistance of the flexographic printing plates to alcoholic and aqueous flexographic printing inks is too low, and this leads to swelling of the printing surface and consequent dot growth. Unsaturated monocarboxylic or polycarboxylic acids forming adducts with rosins include, for example, acrylic acid, methacrylic acid, fumaric acid, maleic acid or their anhydrides. Acrylic acid and maleic acid are preferred. Polyols needed to esterify the adducts are preferably saturated alcohols, pentaerythritol and glycerin being particularly preferred. The epoxide resins required for the final reaction step in preparing the compounds of the invention can be solid or liquid. Their epoxide equivalent weight should be between 100 and 1000 g, and preferably between 150 and 400 g.

The ratio of unsaturated, partially esterified rosin adduct to epoxide resin should be 2:1 to 1:2, preferably 1.5:1 to 1:1.5 , and more preferably 1:1. The epoxide resin and rosin can be added individually to the coating solution of the elastomeric layer and reacted together during the production process, or can be added to the coating solution as a pre-reacted mixture.

The elastomeric layer (c) contains, as binder, 50–95 percent by weight of at least one thermoplastic, elastomeric block copolymer, as disclosed in EP-B1 00 84 851. The average molecular weight of the block copolymer should be over 80,000, preferably over 100,000. Block copolymers with 10 to 30 percent by weight, preferably 10 to 25 percent by weight, polystyrene end blocks are preferred. Two-block and three-block copolymers with polystyrene blocks and polybutadiene or polyisoprene blocks are especially preferred. Radial (polystyrene/polybutadiene)4 with 10 to 30 percent by weight polystyrene content can be primarily used as binders.

The elastomeric layer (c) can also contain 0 to 40 percent by weight of other polymers, preferably thermoplastic polymers. Examples include polymers and copolymers of methyl methacrylate/acrylonitrile/-butadiene/styrene, styrene/methyl methacrylate, acrylonitrile/butadiene/ styrene, butadiene, isoprene, chloroprene, styrene/butadiene, styrene/isoprene or mixtures thereof. Especially suitable are thermoplastic polymers with a turbidity according to ASTM D 1003 equal to or less than 20%, preferably equal to or less than 12%, and a Rockwell hardness, measured according to ASTM D 785 equal to or greater than 50, preferably greater than 80.

Dyes, fillers, initiators, plasticizers, solvents, etc. such as those disclosed in EP-B1 00 84 851 (U.S. Pat. Nos. 4,427,759 and 4,460,675) can be used as additional conventional additives.

The elastomeric layer (c) should be 0.01 to 0.5 mm thick and preferably 0.025 to 0.12 mm thick.

The layer can be applied by coating from solvents, such as toluene, methyl ethyl ketone, acetone, methylene chloride, perchloroethylene, etc., or by extrusion coating directly onto the cover sheet (d), for example, a polyethylene terephthalate sheet, or onto a flexible, polymeric sheet (e) located on the cover sheet (d). Significant improvement in coating quality can be achieved provided the thermoplastic polymer is not dissolved together with other components in an appropriate solvent for preparing the coating solution for elastomeric layer (c). For example, improvements in coating quality can be achieved by (i) dissolving the thermoplastic polymer separately beforehand in the solvent, (ii) prefiltering the polymer-solvent solution, and (iii) adding this solution to a solution of the remaining coating components. The polymeric sheet (e) is 0.0025 mm to 0.04 mm thick, and is soluble in the developer solvent for the photopolymerizable layer (b), or at least, can be stripped off therein. The sheet preferably comprises a polyamide, an ethylene/vinyl acetate copolymer, or similar polymers.

The compounds essential to the invention can be added directly to the coating or extrusion mixture for preparing layer (c). Alternatively, the polymers can be prepared directly in this layer, after coating or extruding an elastomeric mixture containing appropriate quantities of starting compounds for the compounds of the invention and thermal treating such a layer.

The photopolymerizable layer (b) of the invention's printing element contains at least one elastomeric binder. Suitable binders include the block copolymers described in DE-C3 22 15 090 (U.S. Pat. Nos. 4,323,639; 4,323,637; 4,369,246; and 4,423,135), U.S. Pat. Nos. 4,320,188, and 4,162,919. Preferred block copolymers are the A-B-A type having an elastomeric block, for example, polybutadiene or polyisoprene, between two thermoplastic blocks, for example, polystyrene. Linear and radial block copolymers with polystyrene end blocks are especially preferred, such as, for example, polystyrene/polyisoprene/polystyrene, (polystyrene/- polybutadiene)₄Si or (polystyrene/polyisoprene)₄Si. The average molecular weight of the block copolymers should be between 80,000 and 300,000, preferably between 100,000 and 250,000. The polystyrene proportion should be 10 to 40 percent by weight, preferably 15 to 30 percent by eight.

The photopolymerizable layer (b) also contains at least one ethylenically unsaturated monomer addition-polymerizable by actinic radiation. Monomers having one ethylenically unsaturated group as well as those having several ethylenically unsaturated groups can be used in practicing the invention. The monomers can be used alone or in combination with one another. Monomer mixtures of monounsaturated acrylates and/or methacrylates and polyunsaturated acrylates and/or methacrylates are preferred. Such monomer mixtures are described in DE-C1 37 44 243 (U.S. Ser. No. 07/274,464).

Monomers suitable for practicing the invention include octyl acrylate, isodecyl acrylate, isodecyl methacrylate, 2-hexyloxyethyl acrylate, 1,4-butanediol diacrylate, 1,6-hexanediol diacrylate, 1,6-hexanediol dimethacrylate, and trimethylol propane triacrylate.

In addition, the photopolymerizable layer (b) contains a photoinitiator or photoinitiator system, such as for example, α-methyl benzoin, benzophenone, benzil dimethyl ketal, or ethyl anthraquinone/4,4'-bis(dimethylamino)benzophenone. The photopolymerizable layer (b) can further contain other additives, such as, for example, fillers, dyes, antioxidants, and plasticizers, as disclosed in EP-B1 00 84 851 (U.S. Pat. Nos. 4,427,759 and 4,460,675). Plasticizers, 0–30 percent by weight, based on polystyrene or polybutadiene and with an average molecular weight between 1,000 and 10,000, are preferred.

The photopolymerizable layer (b) generally contains 65–95 percent by weight binder, 5–30 percent by weight monomer or monomer mixture, and 0.5–5 percent by weight initiator.

The photopolymerizable layer rests on a support layer (a). Suitable supports include, for example, aluminum, steel synthetic resin sheets. Polyester sheets, optionally coated with an adhesive layer and/or an antihalation layer, are preferred. Polyethylene terephthalate sheets are especially preferred.

The photopolymerizable printing element of the invention is preferably prepared by the process described in EP-B1 00 84 851 (U.S. Pat. Nos. 4,427,759 and 4,460,675). In this process, a previously extruded photopolymerizable composition is fed into the nip of a calender and calendered between a support and a cover element comprising a cover sheet (d) an optional flexible sheet (e), and the elastomeric layer (c) of the invention. A photopolymerizable layer bounded on one side by the support and on the other side by elastomeric layer (c) of the cover element is thus formed.

The photopolymerizable printing element prepared in the manner discussed above, is cooled and optionally pre-exposed with actinic radiation through the support. The cover sheet is usually removed, and an image-bearing transparency is placed on the photopolymerizable printing element. The element is then exposed through the transparency with actinic radiation. The optional, flexible, polymeric sheet (e), the unexposed areas of the photopolymerizable layer (b), and of the elastomeric layer (c) are removed by washoff with a developer solvent, such as chlorinated hydrocarbons. Examples of such developers include 1,1,1-trichloroethane, or saturated or aromatic hydrocarbons, which can be optionally mixed with alcohols, such as, for example, n-butanol. The solvents disclosed in German Patent Application P 38 28 551 (U.S. Ser. No. 07/604,986), are preferred. The solvent can be applied in any manner for development. For example, drenching, immersing, spraying, or roller application are all acceptable methods for applying the developer. Removal of non-crosslinked areas of the layer can be facilitated with brushes. Following development, the resulting printing plate is dried at 40° to 75° C. and then postexposed and/or treated, for example, with a solution containing free halogen, to produce a non-tacky surface. The postexposure and treatment steps can take place in any sequence.

The following examples serve to illustrate the practice of the present invention.

EXAMPLES

Percents and parts given in the following examples are related to weight, unless otherwise stated.

| | |
|---|---|
| Polystyrene/polyisoprene/polystyrene block copolymer 15% polystyrene, Brookfield viscosity 1600 mPa.s (25% in toluene) | 67.4% |
| Methyl methacrylate/acrylonitrile/butadiene/styrene tetrapolymer 46/9/14/31 | 31.3% |
| Acid blue (C.I. 13390) | 1.3% |

A multilayer cover element was prepared according to the following procedure: The dye and the tetrapolymer were kneaded together at 116° C. and then extruded and granulated. This mixture and the remaining components of elastomeric layer (c) were processed into a 15% solution in methylene chloride. The resulting coating solution was applied by means of an extrusion slit coater with a 0.38 mm slit width onto the polyamide coating on a polyethylene terephthalate support, as described in Example 1 of EP-B1 00 84 851 (U.S. Pat. Nos. 4,427,759 and 4,460,675). The coated support was then dried, and provided with a silicone-coated polyethylene terephthalate protective layer. The dry layer thickness was 0.051 mm.

A flexographic printing element was prepared as follows: The following photopolymerizable mixture was prepared, as in Example 1 of EP-B1 00 84 851, in a twin-screw extruder, extruded, and calendered between a polyethylene terephthalate support and the elastomeric layer (c) of the above-described cover element, after the polyethylene terephthalate protective layer had been removed:

| | Parts |
|---|---|
| 2,2-dimethoxy-2-phenyl acetophenone | 1.4 |
| Hexamethylene glycol diacrylate | 5.3 |
| Hexamethylene glycol dimethacrylate | 3.7 |
| 2,6-di-tert-butyl-p-cresol | 0.166 |
| Hydroquinone | 0.001 |
| Red dye (C.I. 109) | 0.003 |
| Hydroxyethyl methacrylate | 0.13 |
| Polystyrene/polyisoprene/polystyrene block copolymer (15% polystyrene molecular weight 150,000) | 82.3 |
| α-methyl styrene/vinyl toluene resin | 6 |
| Microcrystalline hydrocarbon wax | 1 |

After cooling, overall backside exposure through the support, and removal of the polyethylene terephthalate cover layer, an image-bearing transparency was placed on the polyamide layer, and the printing plate was exposed through the transparency with actinic radiation for 6 minutes. The photopolymerizable printing plate was developed by washoff with a tetrachloroethylene/n-butanol mixture (75/25 percent by volume), thus removing the polyamide layer, the unexposed areas of the photopolymerizable layer (b), and of the elastomeric layer (c). As in Example 1 of EP-B1 00 84 851, the flexographic printing plate was then dried, treated with aqueous hypochlorite solution, and post-exposed.

EXAMPLE 2

Composition of elastomeric layer c)

| | |
|---|---|
| Polystyrene/polyisoprene/polystyrene block copolymer 15% polystyrene, Brookfield viscosity 1600 mPa.s (25% in toluene) | 53.2% |
| Methyl methacrylate/acrylonitrile/ butadiene/styrene tetrapolymer, 46/9/14/31 | 24.7% |
| Acid blue (C.I. 13390) | 1.1% |
| Rosin, modified with acrylic acid and partially esterified with glycerin, (acid number 220-250, viscosity about 17 mPa.s at 20° C., 50% in ethanol) | 10.5% |
| Bisphenol A/epichlorohydrin epoxide resin (epoxide equivalent weight 182-194 g, viscosity 9-14 Pa.s at 25° C., according to ASTM D 445) | 10.5% |

A 17% solution in methylene chloride was stirred 24 hours at room temperature and then processed into the elastomeric layer as in Example 1. The printing plate was prepared and processed as described in Example 1. Photosensitivity, exposure latitude and development performance corresponded to the printing plate of Example 1.

EXAMPLE 3

Composition of elastomeric layer c)

| | |
|---|---|
| Radial (polystyrene/polybutadiene)4Si block copolymer 20% polystyrene, viscosity 19 mm$^2$/s (5.23% in toluene) | 51.2% |
| Methyl methacrylate/acrylonitrile/ butadiene/styrene tetrapolymer, 46/9/14/31, turbidity 10% (ASTM 1003), Rockwell hardness 103 (ASTM 785) | 25.6% |
| A copper phthalocyanine dispersed in didecyl phthalate (C.I. 74160) | 1% |
| Rosin, modified with acrylic acid and partially esterified with glycerin (acid number 220-250, viscosity about 17 mPa.s at 20° C., 50% in ethanol) | 11.8% |
| Bisphenol A/epichlorohydrin epoxide resin (epoxide equivalent weight 182-194 g, viscosity 9-14 Pa.s at 25° C., according to ASTM D 445) | 10.4% |

The tetrapolymer was dissolved in toluene/methyl ethyl ketone (4:1) and the solution was filtered. A 17% coating solution was prepared from this solution and the remaining components. Preparation of the elastomeric layer and all other processing steps followed as described in Example 1. Photosensitivity, exposure latitude, and development performance corresponded to the printed plate of Example 1. The printing plate showed remarkably improved stability to ozone.

EXAMPLE 4

Composition of elastomeric layer c)

| | |
|---|---|
| Radial (polystyrene/polybutadiene)4Si block copolymer 20% polystyrene, viscosity 19 mm$^2$/s (5.23% in toluene) | 45% |
| Methyl methacrylate/acrylonitrile/butadiene/styrene tetrapolymer, 46/9/14/31, turbidity 10% (ASTM 1003), Rockwell hardness 103 (ASTM 785) | 22% |
| A copper phthalocyanine dispersed in didecyl phthalate (C.I. 74160) | 1% |
| Rosin, modified with acrylic acid and partially esterified with glycerin, (acid number 220-250, viscosity about 17 mPa.s at 20° C., 50% in ethanol) | 13% |
| Bisphenol A/epichlorohydrin epoxide resin (epoxide equivalent weight 182-194 g, viscosity 9-14 Pa.s at 25° C., according to ASTM D 445) | 19% |

Preparation of the coating solution and elastomeric layer and all other processing steps were conducted as in Example 3. Photosensitivity, exposure latitude, and development performance corresponded to the printing plate of Example 1. The printing plate showed remarkably improved stability to ozone.

EXAMPLE 5

Composition of elastomeric layer c)

| | |
|---|---|
| Radial (polystyrene/polybutadiene)4Si block copolymer 20% polystyrene, viscosity 19 mm$^2$/s (5.23% in toluene) | 50% |
| Methyl methacrylate/acrylonitrile/ butadiene/styrene tetrapolymer, 46/9/14/31, turbidity 10% (ASTM 1003), Rockwell hardness 103 (ASTM 785) | 25% |
| A copper phthalocyanine dispersed in didecyl phthalate (C.I. 74160) | 1% |
| Rosin, modified with acrylic acid and partially esterified with glycerin (acid number 220-250, viscosity about 17 mPa.s at 20° C., 50% in ethanol) | 14% |
| Bisphenol A/epichlorohydrin epoxide resin (epoxide equivalent weight 182-194 g, viscosity 9-14 Pa.s at 25° C., according to ASTM D 445) | 10% |

A mixture of the rosin and epoxide resin was heated with stirring two hours at 175° C. to form a homogeneous composition soluble in toluene. This solution and the remaining components were processed into a 17% solution in toluene/methyl ethyl ketone (4:1). Preparation of the elastomeric layer and all other processing steps followed as in Example 3. Photosensitivity, exposure latitude, and development performance corresponded to the printing plate of Example 1. The printing plate showed remarkably improved stability to ozone.

EXAMPLE 6

Composition of elastomeric layer c)

| | |
|---|---|
| Radial (polystyrene/polybutadiene)4Si block copolymer 20% polystyrene, viscosity 19 mm$^2$/s (5.23% in toluene) | 53% |
| Methyl methacrylate/acrylonitrile/ butadiene/styrene tetrapolymer, 46/9/14/31, turbidity 10% (ASTM 1003), | 27% |

-continued

| | |
|---|---|
| Rockwell hardness 103 (ASTM 785) | |
| A copper phthalocyanine dispersed in didecyl phthalate (C.I. 74160) | 1% |
| Rosin, modified with acrylic acid and partially esterified with glycerin (acid number 220-250, viscosity about 17 mPa.s at 20° C., 50% in ethanol) | 10% |
| Bisphenol A/epichlorohydrin epoxide resin (epoxide equivalent weight 182-194 g, viscosity 9-14 Pa.s at 25° C., according to ASTM D 445) | 9% |

Preparation of the coating solution and elastomeric layer and all other processing steps followed as in Example 3. Photosensitivity, exposure latitude, and development performance corresponded to the printing plate of Example 1. The printing plate showed remarkably improved stability to ozone.

Printing Tests

Printing trials were conducted on a white pigmented polyethylene sheet with an alcoholic flexographic printing ink (CYAN, viscosity 29 mPa.sec/DIN 53211), using a flexographic printing press with a screen roller with 170 lines/cm and 5 g/m$^2$ at a printing rate of 80 m/min.

The printing plates prepared from the photopolymerizable element of the invention demonstrated higher full-tone densities and better reproduction of lines and solid areas than the comparison material.

What is claimed is:

1. A photopolymerizable printing element comprising:
   (a) a support;
   (b) a photopolymerizable layer containing at least one elastomeric binder, at least one ethylenically unsaturated monomer addition-polymerizable by actinic radiation, and a photoinitiator or photoinitiator system;
   (c) an elastomeric layer containing at least one thermoplastic, elastomeric block copolymer; and
   (d) a cover sheet, wherein the elastomeric layer (c) further contains at least one compound produced by (i) reacting rosins with at least one compound selected from the group consisting of ethylenically unsaturated monocarboxylic acids, ethylenically unsaturated monocarboxylic acid anhydrides, ethylenically unsaturated polycarboxylic acids, and ethylenically unsaturated polycarboxylic acid anhydrides, (ii) reacting the compound produced by (i) with at least one polyol to esterify a part of the carboxylic acid groups of the compound produce by (i), and (iii) reacting the compound partially esterified by (ii) with at least one epoxide resin.

2. The photopolymerizable printing element of claim 1, wherein the elastomeric layer (c) contains 5 to 30 percent by weight of the compound produced by (i) reacting rosins with at least one compound selected from the group consisting of ethylenically unsaturated monocarboxylic acids, ethylenically unsaturated monocarboxylic acid anhydrides, ethylenically unsaturated polyucarboxylic acids, and ethylenically unsaturated polycarboxylic acid anhydrides, (ii) reacting the compound produced by (i) with at least one polyol to esterify a part of the carboxylic acid groups of the compound produce by (i), and (iii) reacting the compound partially esterified by (ii) with at least one epoxide resin.

3. The photopolymerizable printing element of claim 1 or 2, wherein the elastomeric layer (c) contains at least one compound produced by (i) reacting rosins with at least one compound selected from the group consisting of acrylic acid, methacrylic acid, fumaric acid, maleic acid, acrylic acid anhydride, methacrylic acid anhydride, fumaric acid anhydride, and maleic acid anhydride (ii) reacting the compound produced by (i) with at least one compound selected from the group consisting of pentaerythritol and glycerol to esterify a part of the carboxylic acid groups of the compound produced by (i) and (iii) reacting the compound partially esterified by (ii) with at least one epoxide resin.

4. The photopolymerizable printing element of claim 1, wherein the elastomeric layer (c) contains 50 to 95 percent by weight of a thermoplastic, elastomeric block copolymer with 15-30 percent by weight polystyrene content.

5. The photopolymerizable printing element of claim 1, wherein the elastomeric layer (c) contains at least one radial (polystyrene/polybutadiene)$_4$Si block copolymer with 15-30 percent by weight polystyrene content.

6. The photopolymerizable printing element of claim 1, wherein the elastomeric layer (c) contains 0 to 40 percent by weight of a thermoplastic polymer having a turbidity of less than 20% and a Rockwell hardness of greater than 50.

7. The photopolymerizable printing element of claim 1, wherein a flexible polymeric sheet (e) is interposed between the elastomeric layer (c) and the cover sheet (d).

8. A process for preparing a photopolymerizable printing element comprising:
   (a) feeding into the nip of a calender, a photopolymerizable composition containing at least one elastomeric binder, at least one ethylenically unsaturated monomer additionally polymerizable by actinic radiation, and a photoinitiator or photoinitiator system;
   (b) calendering the photopolymerizable composition between a support (a) and a multilayer cover element thereby forming a photopolymerizable layer (b) between them, said multilayer cover element comprising an elastomeric layer (c) and a cover sheet (d), wherein the elastomeric layer (c) further comprises at least one thermoplastic elastomeric block copolymer and at least one compound produced by (i) reacting rosins with at least one compound selected from the group consisting of ethylenically unsaturated monocarboxylic acids, ethylenically unsaturated monocarboxylic acid anhydrides, ethylenically unsaturated polycarboxylic acids, and ethylenically unsaturated polycarboxylic acid anhydrides, (ii) reacting the compound produced by (i) with at least one polyol to esterify a part of the carboxylic acid groups of the compound produced by (i), and (iii) reacting the compound partially esterified by (ii) with at least one epoxide resin.

* * * * *